United States Patent [19]

Shou et al.

[11] Patent Number: 5,477,483
[45] Date of Patent: Dec. 19, 1995

[54] MEMORY DEVICE

[75] Inventors: Guoliang Shou; Sunao Takatori; Makoto Yamamoto, all of Tokyo, Japan

[73] Assignee: Yozan Inc., Tokyo, Japan

[21] Appl. No.: 100,176

[22] Filed: Aug. 2, 1993

[30] Foreign Application Priority Data

Aug. 5, 1992  [JP]  Japan .................................. 4-229260

[51] Int. Cl.$^6$ ................................................. G11C 11/40
[52] U.S. Cl. ........................ 365/174; 365/177; 365/154; 365/156; 365/129
[58] Field of Search ................................... 365/174, 177, 365/155, 156, 174, 129

[56] References Cited

U.S. PATENT DOCUMENTS

| | | | |
|---|---|---|---|
| 4,366,554 | 12/1982 | Aoki et al. | 365/155 |
| 4,455,625 | 6/1984 | Denis et al. | 365/154 |
| 4,922,411 | 5/1990 | Hobbs | 365/174 |
| 4,943,740 | 7/1990 | Gulczynski | 365/174 |

FOREIGN PATENT DOCUMENTS 1949406  9/1969  Germany .

OTHER PUBLICATIONS

Pricer, David, "Integrated Circuits" (RAM, ROM), The Electrical Engineering Handbook, Editor-In-Chief, Richard C. Dorf., CRC Press, 1993, pp. 1651–1657.
Patent Abstracts of Japan, vol. 001, No. 136, 10 Nov. 1977 & JPP-A-51 120 141 (Tokyo Shibaura Electric).

*Primary Examiner*—Viet Q. Nguyen
*Attorney, Agent, or Firm*—Cushman, Darby & Cushman

[57]  ABSTRACT

The present invention has an object to provide a memory device without the necessity of refreshment, whose circuit is small size.

A memory device structuring a memory cell by connecting the follows: i) the first transistor of PNP type, having connection of input voltage to its base and grounding an emitter; ii) the second transistor of NPN type having connection of base to a collector of the first transistor, grounding collector and connection of power source to an emitter; and iii) the collector of the second transistor to the base of the first transistor.

3 Claims, 1 Drawing Sheet

MEMORY DEVICE

BACKGROUND OF THE INVENTION

1. Field of the Invention

The present invention relates to a memory device, and in particular, to a memory device that does not need to be refreshed.

2. Description of the Art

Conventionally, a static RAM includes a memory cell made by a flip-flop. However, there are problems in that the size of such a conventional circuit is rather large, the memory capacity is small and it is expensive to make it using flip-flop.

SUMMARY OF THE INVENTION

The present invention solves the above-mentioned problems of the prior art memory devices and has an object to provide a memory device without the necessity of refreshment, wherein the circuit is small in size. The memory device of this invention comprises a self-holding circuit formed by a couple of transistors.

PREFERRED EMBODIMENT OF THE PRESENT INVENTION

Hereinafter, the present invention is described with reference to the attached drawings.

Figure 1:
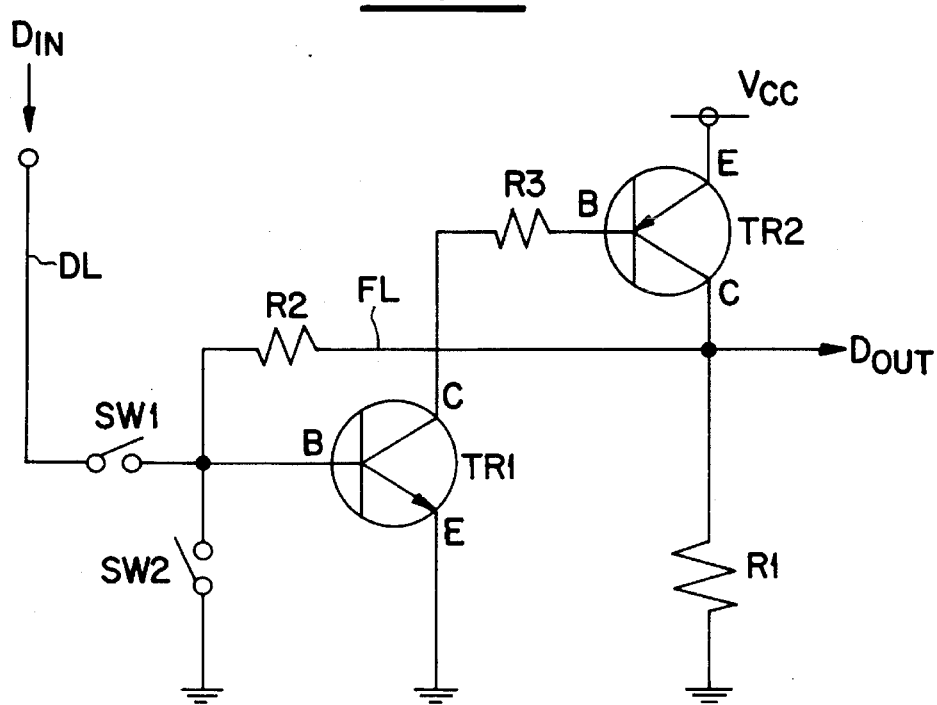
FIG. 1 shows a circuit according to a first embodiment of this invention.

FIG. 1 shows one memory cell in a memory device. The memory device according to the embodiment illustrated in FIG. 1 forms a self-holding circuit a first NPN transistor TR1 and a second PNP transistor TR2.

The base of transistor TR1 is connected to a data line DL through a switch SW1 which is opened and closed by an address control (not shown). When data "Din" is at a high level, switch SW1 is closed, then the gate voltage of transistor TR1 is set to a high level and the transistor TR1 is conductive. Collector "C" of transistor TR1 is connected to the base of the second transistor TR2, and emitter "E" of transistor TR1 is grounded. Therefore, when transistor TR1 is conductive, the base of transistor TR2 is set to a low level and transistor TR2 is conductive. Emitter "E" of transistor TR2 is connected to power source "Vcc" and collector "C" of transistor TR2 is grounded. The electric voltage of the collector "C" rises under conduction.

The collector "C" of transistor TR2 is connected to the base "B" of transistor TR1 through conductor "FL". Even when switch SW1 is opened after transistor TR1 is once conductive, transistor TR1 remains conductive due to the electric voltage of collector "C". Thus, the circuit in FIG. 1 forms a self-holding circuit. The electric voltage of collector "C" is output as output data "Dout". The collector "C" of transistor TR2 is grounded through a high resistance "R1", which maintains the level of "Dout".

A grounded reset switch SW2 is connected to the base of transistor TR1 in order to reset the memory cell once in high level back to a low level. When reset switch SW2 is closed, the base of transistor TR1 is grounded and transistor TR1 is shut off. A protection resistance R2 is provided on the conductor FL so as to prevent large levels of electric current from being passed to transistor TR2 when reset switch SW2 is closed. Protecting resistance R3 is set between collector "C" of transistor TR1 and base "B" of transistor TR2 so as to protect transistor TR1 in a conductive state of transistor TR1.

In this way, it is possible to construct a memory cell without the necessity of refreshment and to realize a memory device having a small-sized constructed from a couple to transistors.

Figure 2:
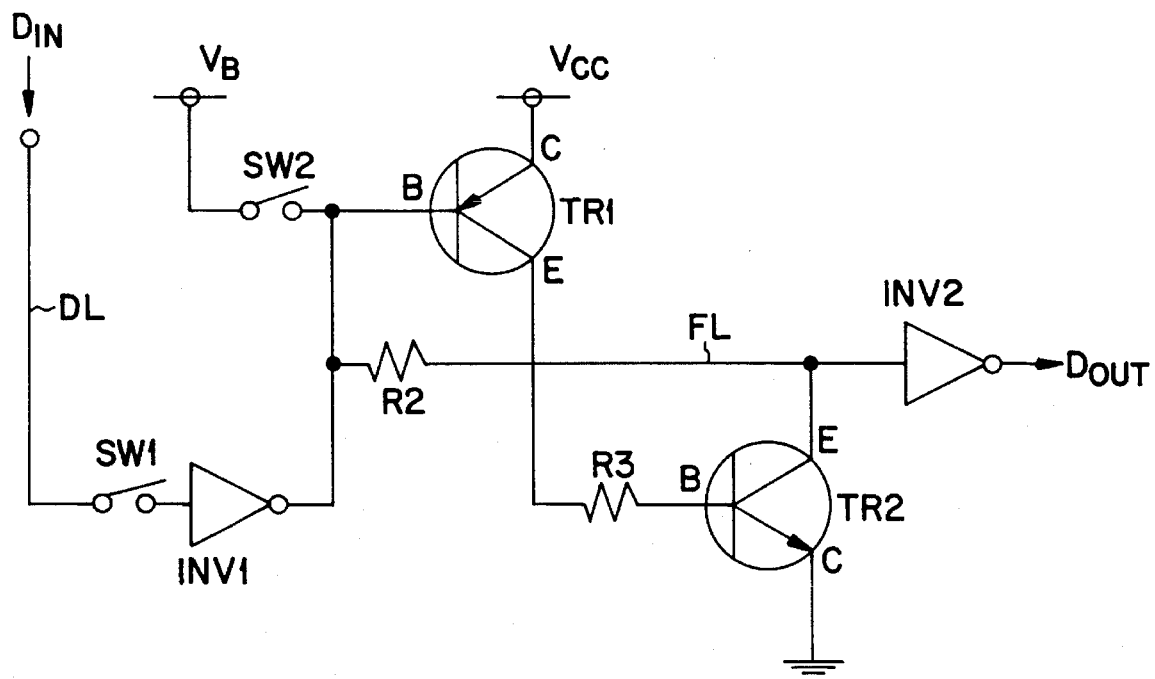
FIG. 2 shows a circuit according to a second embodiment of this invention.

FIG. 2 shows a memory circuit according to a second embodiment of this invention. The same parts as those illustrated in the circuit of FIG. 1 are given the same alphabetical symbols. In this embodiment, the first transistor TR1 is PNP type and the second transistor TR2 is NPN type. Data "Din" is input to transistor TR1 through inverter "INV1" and transistor "TR1" is reset by reset switch SW2 connected to a power source "$V_B$". As in FIG. 1, a protective resistance R3 is connected between emitter "E" of transistor "TR1" and base "B" of transistor "TR2".

Collector "C" of transistor "TR1" is connected to power source "$V_{CC}$" and emitter "E" of transistor TR1 is connected to the base of transistor "TR2". When high level data Din is input to inverter INV1 through switch SW1, a low level of electric voltage is impressed on the base of transistor TR1 and transistor TR1 is conductive. Then, a high level of electric voltage of power source $V_{CC}$ is impressed on the base of transistor TR2 and transistor TR2 is made conductive. The collector of transistor TR2 is grounded: when it is conductive, emitter "E" is at a low level.

The emitter "E" of transistor TR2 is connected to the base "B" of transistor TR1 through conductor "FL", and the electric voltage of the base of TR1 is kept low level during conduction of transistor TR2. Therefore, the state of transistors TR1 and TR2 is maintained unchanged. Inverter INV2 is connected to the emitter E of transistor TR2. The output of inverter INV2 corresponds to the output data of Dout. Protective resistance "R2" is provided on conductive FL, which prevents large levels of electric current from power source $V_B$ from passing to transistor TR2 during reset.

It is possible to realize a memory device without the necessity of refreshment comprising a small size circuit.

As mentioned above, because a memory device of this invention forms a self-holding circuit using only a couple of transistors, it is not necessary to be refreshed and has a small size.

What is claimed is:

1. A memory cell in a memory device including a power supply, said memory cell comprising:

i) an input terminal;

ii) a first NPN transistor having a base, a collector, and an emitter operatively connected to ground;

iii) a second PNP transistor having a base operatively connected to said collector of said first transistor, a collector and an emitter, said emitter being operatively connected to said power supply, wherein said collector of said second transistor is operatively connected to said base of said first transistor iv) a switching arrangement for selectively operatively connecting said base of said first NPN transistor to one of an input voltage via said terminal and ground; and v) an output terminal provided at said collector of said second PNP transistor.

2. A memory cell according to claim 1, further comprising a protecting resistor provided in a conductor operatively connecting said collector of said second PNP transistor to said base of said first NPN transistor.

3. A memory cell according to claim 1, further comprising a resistor having a first terminal operatively connected to ground and a second terminal operatively connected to said collector of said second PNP transistor.

* * * * *

UNITED STATES PATENT AND TRADEMARK OFFICE
CERTIFICATE OF CORRECTION

PATENT NO.  : 5,477,483
DATED       : Dec. 19, 1995
INVENTOR(S) : SHOU et al.

It is certified that error appears in the above-identified patent and that said Letters Patent is hereby corrected as shown below:

ON THE COVER PAGE:
Reads:

[73] Assignee: Yozan Inc., Tokyo, Japan

Should Read:

[73] Assignee: Yozan Inc., Tokyo Japan
                          Sharp Corporation, Osaka, Japan Signed and Sealed this Fourteenth Day of May, 1996

*Attest:*

BRUCE LEHMAN

*Attesting Officer*        *Commissioner of Patents and Trademarks*